United States Patent [19]

Greub

[11] Patent Number: 4,833,649
[45] Date of Patent: May 23, 1989

[54] MULTIPLE PORT RANDOM ACCESS MEMORY

[75] Inventor: Hans J. Greub, Troy, N.Y.

[73] Assignee: Tektronix, Inc., Beaverton, Oreg.

[21] Appl. No.: 93,931

[22] Filed: Sep. 8, 1987

[51] Int. Cl.[4] .............................................. G11C 7/00
[52] U.S. Cl. .......................... 365/189.06; 365/230.05
[58] Field of Search .............. 365/189, 155, 179, 230, 365/233

[56] References Cited

U.S. PATENT DOCUMENTS

| | | | |
|---|---|---|---|
| 4,541,076 | 9/1985 | Bowers et al. ................... | 365/189 X |
| 4,623,990 | 11/1986 | Allen et al. ......................... | 365/189 |
| 4,656,614 | 4/1987 | Suzuki ................................ | 365/230 |
| 4,719,596 | 1/1988 | Bernstein et al. .................. | 365/189 |

Primary Examiner—Joseph A. Popek
Attorney, Agent, or Firm—Daniel J. Bedell; Robert S. Hulse

[57] ABSTRACT

A multiple port memory includes a set of memory units each comprising a set of memory cells, one corresponding to each port. Each cell of a memory unit stores a single data bit and each cell is independently read and write accessed through separate data, address and control busses. The cells of each memory unit are cross-coupled so that when the state of the bit stored by one of the cells of a memory unit is changed when write accessed, the other cells of the memory unit thereafter change the states of their stored bits in the same way.

12 Claims, 3 Drawing Sheets

MULTIPLE PORT RANDOM ACCESS MEMORY

BACKGROUND OF THE INVENTION

The present invention relates to random access memories and in particular to a dual port random access memory which permits two data processing devices to read or write access the memory at the same time.

In many applications more than one data processing device competes for read or write access to the same random access memory. For example, in a high speed computer system, a direct memory access (DMA) controller may be capable of reading sequences of data stored in a memory and placing that data on a system input/output bus, and may also be capable of acquiring data on the input/output bus and storing that data in the memory. Such memory access may be performed by the DMA controller at the same time that a central processor of the computer is performing other operations. However, since the processor must also have read and write access to the memory, the processor may be restricted to performing operations which do not involve memory access when the DMA controller is accessing the memory. Inasmuch as processors access memory frequently, such a restriction can adversely affect system performance. Dual memories have been developed which permit more than one data processing device to access data at different storage locations at the same time. But during a write operation data must be written into corresponding cells of both memories, and such dual memories have relatively longer memory access times than comparable single memories due to increased input capacitance seen by input data and control signals, and this capacitance must be charged or discharged in order to effect a change of state of the stored data.

SUMMARY OF THE INVENTION

In accordance with the invention, in a preferred embodiment thereof, a dual port memory permits two data processing devices to read or write access data stored therein at the same time. The dual port memory includes a set of dual port memory units, each memory unit comprising a pair of memory cells. Each cell of a memory unit stores a single data bit and each cell is independently read/write accessible. However the cells are cross-coupled in such a way that if the state of the bit stored by one of the cells is changed during a write operation, the other cell changes the state of its stored bit in the same way following the write operation.

Each memory cell responds to a separate two-state read/write enable signal, a separate three-state data input signal, and a common two-state cross-coupling signal. The read/write enable signal is asserted when the cell is addressed for either a read or a write access. The data input signal indicates the state to which the data bit is to be set during a write access, and is therefore set to first or second states (i.e., positive or negative voltage levels) when the cell is to be write accessed. When the cell is not to be write accessed, the data input signal is set to a third (zero voltage) state of logic level intermediate the first and second states. The cross-coupling signal normally has the same state as the bits stored in each cell, but each cell may change the state of the cross-coupling signal whenever the state of its stored bit changes as a result of a write operation. Each memory cell generates a three-state data output signal. When the read/write enable signal is asserted while the data input signal is of the third state, the memory cell sets its data output signal to a first or a second state (positive or negative) in accordance with the state of its stored data bit. When the read/write enable signal is not asserted, the memory cell sets the data output signal to a third state intermediate the positive and negative logic levels.

When the read/write enable signal input to a cell is not asserted, the cell sets its stored data bit to a state to match the state of the cross-coupling signal, and therefore changes the state of its stored data bit whenever the other cell changes the state of the cross-coupling signal.

The speed at which a data bit may be set to a desired state when a cell is write enabled is limited by the amount of cell input capacitance that the read/write enable signal must charge or discharge in order to change the state of the stored bit. In accordance with the present invention, the separate memory cells are cross-coupled by an active coupling circuit that provides additional charging current when needed following the write operation so as to minimize the effects of cross-coupling on the speed with which data may be written into each cell.

It is accordingly an object of the invention to provide a high speed, multiple port memory that can be simultaneously read or write accessed by multiple data processing devices at the same time.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings werein like reference characters refer to like elements.

DRAWINGS

DETAILED DESCRIPTION

Figure 1:
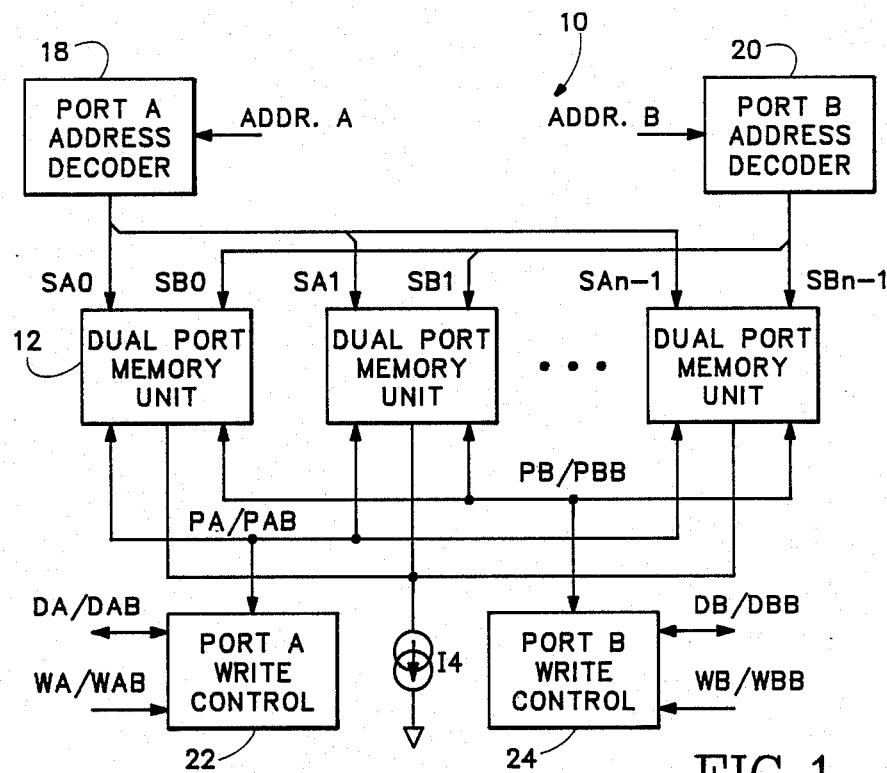
FIG. 1 is a block diagram of a dual-port memory in accordance with the present invention.

With reference to FIG. 1, a dual-port memory 10 in accordance with the present invention is adapted to provide concurrent read and/or write access to two data processing devices via separate data, address and control busses. Memory 10 stores n bits, each bit being stored at a separate address. For each address there is provided a separate dual port memory unit 12, shown in more detailed block diagram form in FIG. 2, comprising a pair of memory cells ("cell A" 14 and "cell B" 16). Each cell of the pair is independently accessible by separate bidirectional differential data signals (PA/PAB and PB/PBB), separate binary read/write enable signals (SA* and SB*, where "*" represents the cell address 0 through n-1), and a current signal from a current source I.

An SA* or an SB* read/write enable signal is asserted when the cell to which it is applied is to be read or write accessed. A selected one of the SA* read/write enable signals is asserted by a port A address decoder 18 of FIG. 1 which decodes an address transmitted on a port A address bus ADDR.A from an external data processing device (not shown) seeking to read or write access cell A of a particular one of the memory units 12. Only one SA* read/write enable signal is asserted at any given time. Similarly, one of the SB* read/write enable signals is asserted by a port B address decoder 20 which decodes an address transmitted on a port B address bus ADDR.B by another external data processing device (not shown) seeking to read or write access a cell B of one of the memory units 12.

Figure 2:
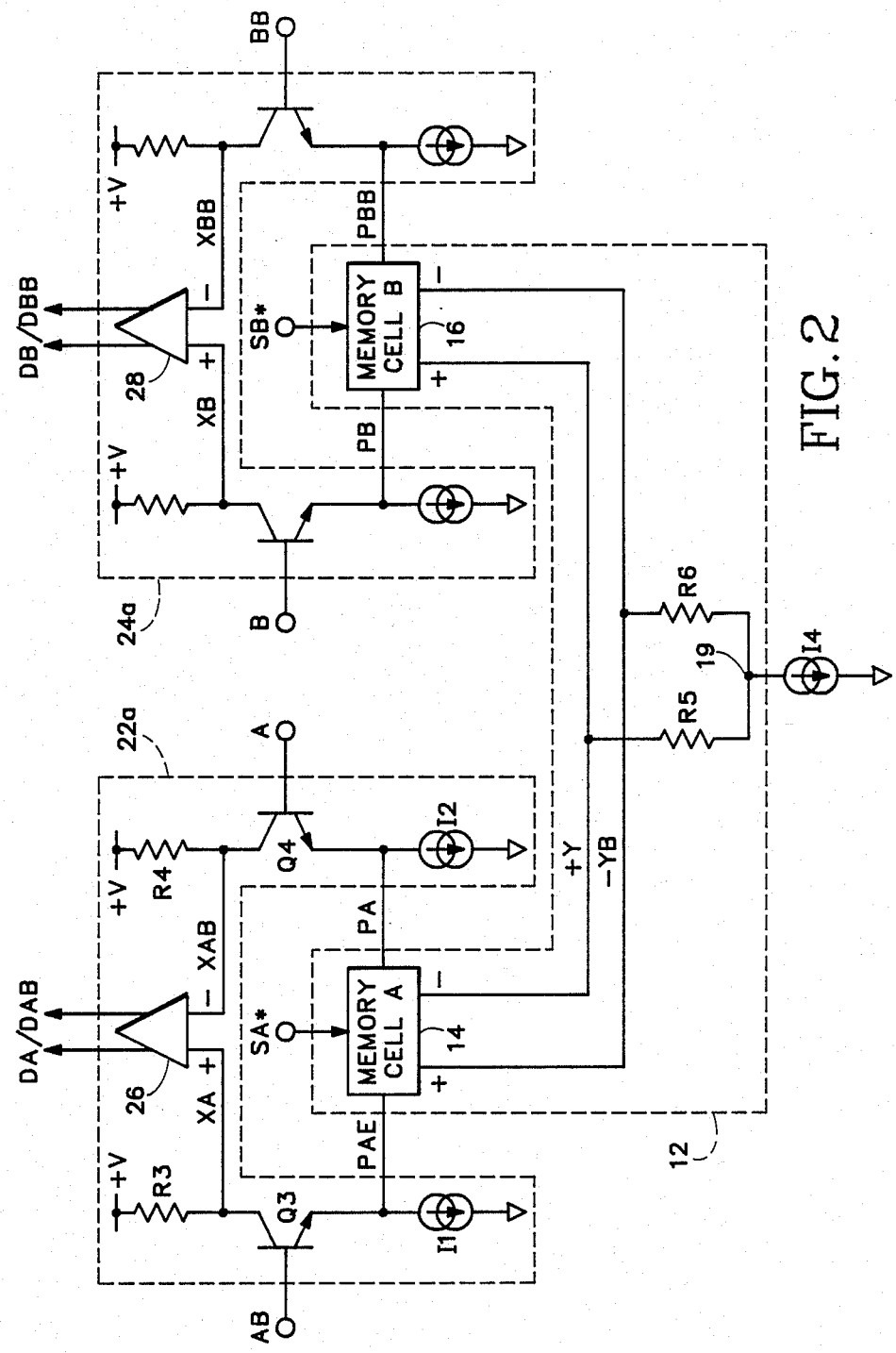
FIG. 2 is a combination block and schematic diagram of a dual-port memory unit and portions of the port A and port B write control circuits of FIG. 1.

The PA/PAB data signal, applied in common to each cell A of each memory unit 12, is produced by a port A write control circuit 22 (a portion 22a of which is also shown in FIG. 2) which monitors the state of a data bit conveyed on a port A data bus DA/DAB of FIG. 1, and also monitors a differential write control signal WA/WAB produced by a processing device seeking access to cell A of one of the memory units 12. When the processing device write accesses a particular cell A, the processing device places a data bit of appropriate state in port A data bus DA/DAB, sets the address of the cell on address bus ADDR.A, and asserts the write control signal WA/WAB. The write control circuit 22 then sets the state of the PA/PAB data signal to a first or a second (positive or negative voltage) state in accordance with the state of the bit on the port A data bus DA/DAB. The particular cell A enabled by the read/write enable signal SA* produced by port A address decoder 18 then sets the state of its stored bit to match the state of the PA/PAB data input signal. Thereafter, the data processing device accessing the memory deasserts the write control signal WA/WAB thereby causing the port A write control circuit 22 to set the data signal PA/PAB to a third state.

With reference to FIG. 2, port A write control circuit 22 produces a data output signal XA/XAB applied to the input of a differential amplifier 26, the output of which is connected to the port A data bus DA/DAB. To read access a particular cell A, a processing device places the address of the cell on port A address bus ADDR.A causing port A address decoder 18 to assert the appropriate read/write enable signal SA . However, the processing device does not assert the write control signal WA/WAB input to port A write control circuit 22. When the write control signal WA/WAB is not asserted, control circuit 22 monitors the state of the PA/PAB data signal, and the particular cell A enabled by an asserted SA* read/write enable signal sets the state of the PA/PAB data signal positive or negative to match the state of its stored data bit. Write control circuit 22 then drives the state of the bit on the port A data bus DA/DAB positive or negative in response to the PA/PAB data signal. Thus in order to read access a cell A of a particular memory unit 12, a data processing device need only set the address of the cell on the ADDR.A bus without asserting the WA/WAB write control signal and then read the data bit appearing on the DA/DAB lines.

During a write access to a cell B, a port B write control circuit 24, similar to write control circuit 22, monitors a WB/WBB write control signal from another data processing device, monitors the state of a bit on a DB/DBB data bus and controls a PB/PBB data signal applied to the cell B of each memory unit 12. During a read access, cell B of an addressed memory unit 12 controls the state of the PB/PBB data signal which signal causes port B write control circuit 24 to set the state of the bit on the DB/DBB bus. A portion 24a of port B write control circuit 24 is also shown in FIG. 2 and is similar to portion 22a of port A write control circuit 22.

As shown in FIG. 2, cell A and cell B of each memory unit 12 are each accessed by a differential cross-coupling signal Y/YB developed across a pair of series-connected resistors R5 and R6. Current source I4 supplies current to a junction node 19 between a pair of resistors R5 and R6. When the bits stored in cells A and B are of matching positive or negative states, cross-coupling signal Y/YB is of a similar positive or negative state. When the state of the bit stored in either one of the cells A or B is changed during a data write access, that cell changes the state of the cross-coupling signal Y/YB, and the change in state of the cross-coupling signal forces a change in state of the bit signal forces a change in state of the bit stored in the other cell immediately following the write operation. Thus, during a write operation the cell being write accessed controls the state of the cross-coupling signal Y/YB in accordance with the state of its data input signal, and the cell that is not being write accessed responds to the cross-coupling signal by appropriately setting the state of its stored data bit following the write operation.

Figure 3:
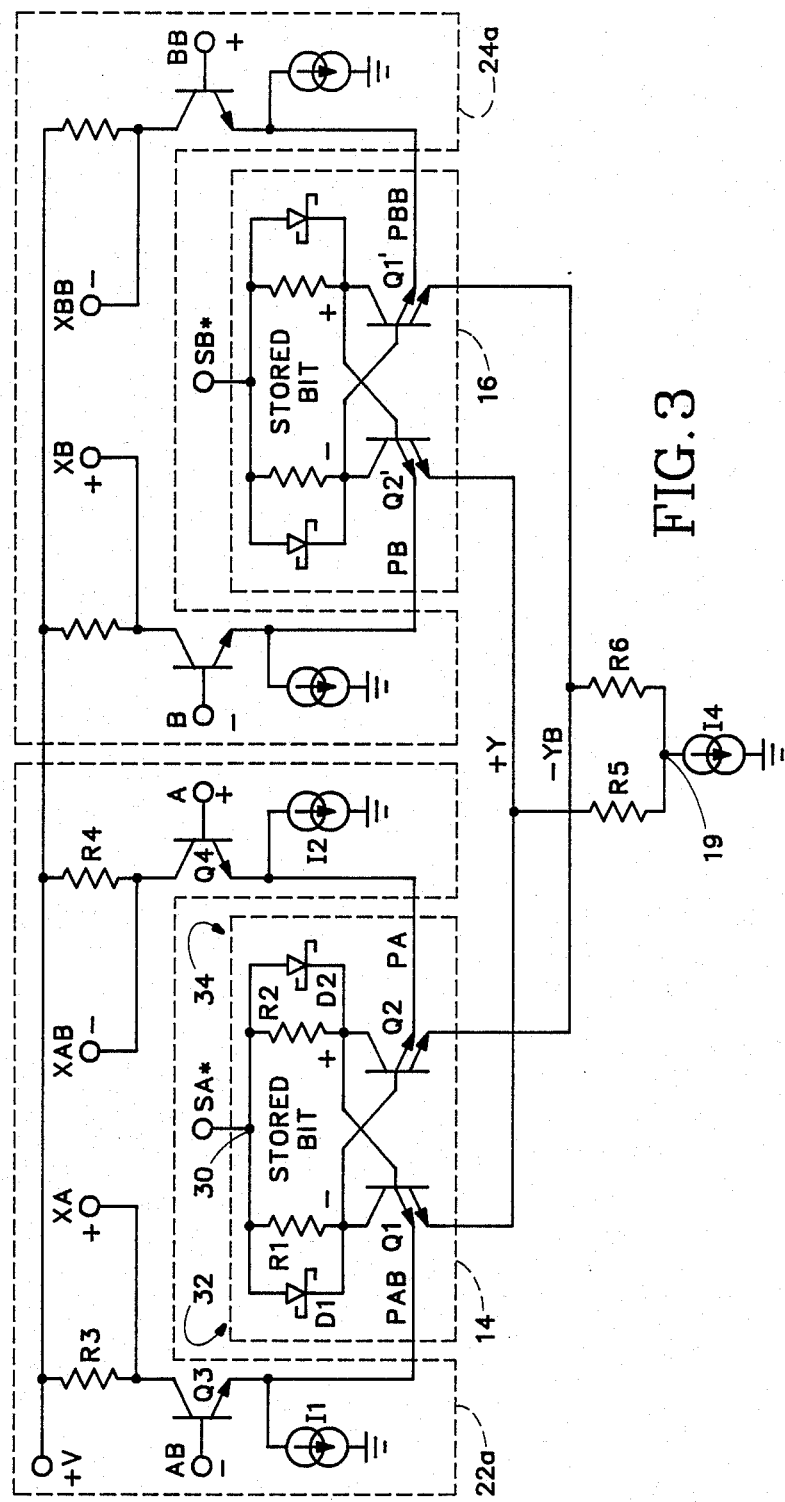
FIG. 3 is a schematic diagram showing portions of the circuits of FIG. 2 in more detail.

With reference to FIG. 3, memory cell A (device 14) includes first and second two-emitter transistors Q1 and Q2, the collector of transistor Q1 being connected to the base of transistor Q2 and the collector of transistor Q2 being connected to the base of transistor Q1. The collector of transistor Q1 is also coupled to a circuit node 30 through a voltage clamp 32 consisting of a parallel combination of a Schottky diode D1 and a resistor R1. Similarly, the collector of transistor Q2 is also coupled to circuit node 30 through another voltage clamp 34 consisting of a parallel combination of another Schottky diode D2 and another resistor R2. The read/write enable signal SA* is applied to node 30. A data input signal A/AB is applied across the bases of third and fourth transistors Q3 and Q4 of write control circuit 22 having collectors coupled to a voltage source +V through resistors R3 and R4, respectively. The emitter of transistor Q3 is connected to a first emitter of transistor Q1 and also to a first current source I1. Similarly, the emitter of transistor Q4 is connected to the first emitter of transistor Q2 and to a second current source I2. The data signal PA/PAB appears across the emitters of transistors Q3 and Q4. The cross-coupling signal Y/YB is applied across second emitters of transistors Q1 and Q2 such that when Y/YB is positive, the second emitter of Q1 is higher in potential than the second emitter of Q2. Memory cell B (device 16) is similar to memory cell A except that the cross-coupling signal is applied across the second emitters of transistors Q1' and Q2' (corresponding to transistors Q1 and Q2 of cell A) with opposite polarity such that when Y/YB is positive, the emitter of Q2' is higher in potential than the emitter of Q1'.

Referring to FIGS. 2 and 3, the state of the bit stored by cell A is determined by whether transistor Q1 or transistor Q2 is on. The stored bit is in its first state (positive) when transistor Q1 is on and transistor Q2 is off, and is in its second state (negative) when transistor Q2 is on and transistor Q1 is off. When transistor Q1 is on, it supplies current via resistor R5 to current source I4, and its collector potential is pulled below the voltage of read/write enable signal SA*. Since the collector of transistor Q1 is low, the base of transistor Q2 is low and transistor Q2 tends to stay off. Since transistor Q2 is off, resistor R2 pulls the voltage of its collector and the base of transistor Q1 up, thereby tending to keep transistor Q1 on. Similarly, when transistor Q2 is on, it supplies current via resistor R6 to current source I4 and its collector is pulled below the voltage of read/write enable signal SA by the amount of the drop across diode D2. Since the collector of transistor Q2 is low, the base of transistor Q1 is low and transistor Q1 is off. Since transistor Q1 is off, resistor R1 pulls the base of transistor Q2 up, thereby tending to keep transistor Q2 on.

The state of the bit stored in cell A (i.e., the polarity of the potential between collectors of transistors Q2 and Q1) may be altered during a write operation. For example, to switch the stored bit from negative to positive (second state to first state) the data input signal A/AB is set positive such that the potential at the base of transistor Q4 is higher than the potential at the base of transistor Q3. Therefore, the emitter of transistor Q3 will be at a lower potential than the emitter of transistor Q4. The read/write enable signal SA* is then asserted, thereby pulling up the bases of both transistors Q1 and Q2. Since the first emitter of transistor Q1 is at a lower potential than the first emitter of transistor Q2, and is sufficiently lower than its base potential to permit transistor Q1 to turn on, transistor Q1 begins to conduct some of the current of current source I4. The increased collector current through transistor Q1 pulls down the potential of the base of transistor Q2 and transistor Q2 begins to conduct less current. The collector potential of transistor Q2 therefore rises and helps to turn on transistor Q1. This positive feedback between the collectors and bases of transistors Q1 and Q2 quickly causes transistor Q1 to turn on and transistor Q2 to turn off, thereby changing the state of the stored bit from negative to positive.

To switch the stored bit from positive to negative (first state to second state), the data input signal A/AB is set negative (its second state) wherein the potential at the base of transistor Q3 is higher than the potential at the base of transistor Q4. Thus the first emitter of transistor Q2 is driven to a lower potential than the first emitter of transistor Q1. When the read/write enable signal SA* is asserted, transistor Q2 begins to conduct more current than transistor Q1 and increased collector current through transistor Q2 pulls down the base of transistor Q1 which begins to turn off. Positive feedback between transistors Q1 and Q2 quickly turns transistor Q1 off and turns transistor Q2 on, thereby switching the state of the stored bit.

During other than a write operation, the data input signal A/AB is set to its third state (zero volts) wherein the bases of transistors Q3 and Q4 are held at the same potential. In such case, the collector-emitter impedances of transistors Q3 and Q4 are substantially equal and the state of the differential data output signal XA/XAB depends on the relative amount of current in the collectors of transistors Q3 and Q4. The magnitudes of resistors R3 and R4 and the magnitudes of current sources I1 and I2 are chosen so that when the read/write enable signal SA* is low, i.e., when cell A is not read/write enabled, the first emitters of transistor Q1 and transistor Q2 are at higher potentials than their bases and no current flows in the first emitters. Transistors Q3 and Q4 conduct the same amount of current, and the voltage drops across resistor R3 and resistor R4 are equal. Thus the output data signal XA/XAB is at 0 differential voltage, its "third" logic state.

However, when, during a read operation the read/write enable signal SA* is driven high while for example, transistor Q1 is on and transistor Q2 is off, the base of transistor Q1 rises above the potential of its first emitter by an amount sufficient to produce a current in its first emitter. This current reduces the amount of collector current that is supplied through transistor Q3 and causes the potential at the collector of transistor Q3 to rise above the potential of the collector of transistor Q4. Thus, the output data signal XA/XAB is driven to its positive first state.

On the other hand, when during a read operation the read/write enable signal SA* is driven high, while transistor Q2 is on and transistor Q1 is off, the base of transistor Q2 rises above the potential of its first emitter by an amount sufficient to produce a current in its first emitter. This current reduces the amount of current that is supplied through transistor Q4, thereby causing the potential at the collector of transistor Q4 to rise above the potential of the collector of transistor Q3. Thus, the output data signal XA/XAB is driven to its negative second state.

It should be noted that cell A also changes the state of the cross-coupling signal Y/YB when it changes the state of its stored bit during a write operation. For example, if the stored bit is in its positive, first state, transistor Q1 is on, transistor Q2 is off, and the cross-coupling signal Y/YB is positive. When during a write operation cell A subsequently turns on transistor Q2 and turns off transistor Q1, the cross-coupling signal switches to its negative state. Cell B is similar to cell A, and it too can change the state of the cross-coupling signal Y/YB when the state of its stored bit changes during a write operation.

When cell A changes the state of the cross-coupling signal as it is being write accessed, cell B does not immediately respond to the change in cross-coupling signal state because the current of current source I4 is supplied entirely through cell A and therefore transistors Q1' and Q2' are off. When cell A is no longer write enabled, SA* is driven low, causing current source I4 to pull down the potential at node 19. The second emitter of one of transistors Q1' and Q2' is thus pulled lower than the other depending on the state of the cross-coupling signal Y/YB, causing one of transistors Q1' and Q2' to turn on, thereby setting the state of its stored bit to match the state of the cross-coupling signal. In a similar manner, cell A also sets the state of its stored bit to match the state of the cross-coupling signal after cell B has been write accessed.

The speed at which a stored data bit may be set to a desired state when a cell is write enabled is affected by the amount of input capacitance that the read/write enable signal SA* or SB* must charge or discharge in order to change the state of the stored bit. With reference to FIG. 3, such input capacitance comprises primarily the base-emitter, and collector-emitter capacitance of transistors Q1 and Q2. Due to the manner in which cells A and B are cross-coupled, the SA* or SB* signal of a cell being write accessed does not have to charge or discharge the input capacitance of the other cell in order to cause a change of state of the bit stored therein, the necessary charging current being supplied instead by current source I4 following the write access. Therefore, the input capacitance of cell B does not affect the speed with which cell A can be write accessed and the period required to write access a dual port memory unit may be substantially as short as a single port memory cell which is not cross-linked to another cell.

Figure 4:
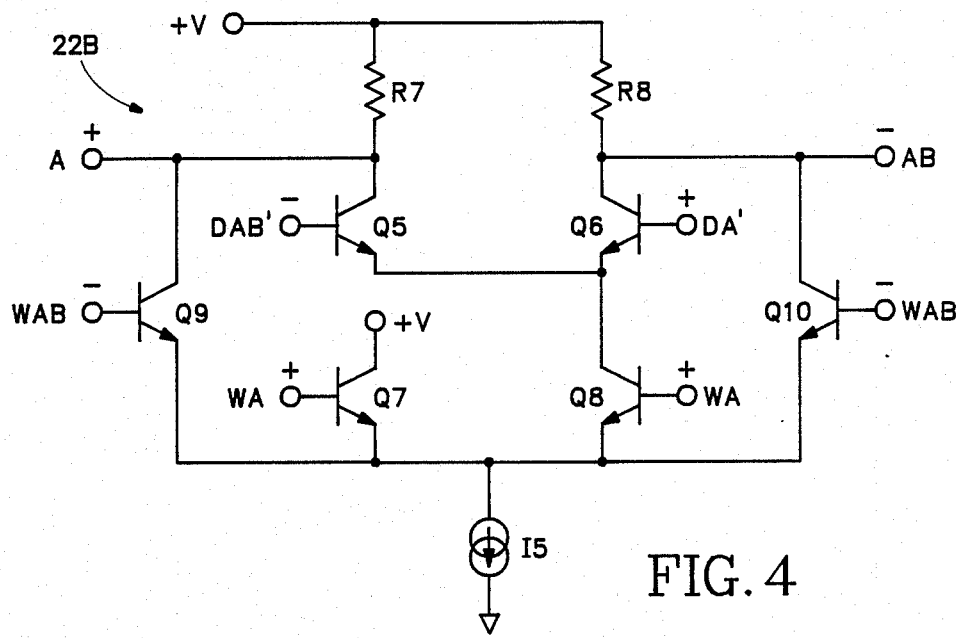
FIG. 4 is a schematic diagram of a portion of the port A write control circuit of FIG. 1.

FIG. 4 shows another portion 22b of the port A write control circuit 22 of FIG. 1 in schematic diagram form. The port B write control circuit is similar. Write control circuit 22 comprises a set of transistors Q5–Q10, resistors R7 and R8, and a current source I5. The emitters of transistors Q7–Q10 are coupled to a current source I5, and the emitters of transistors Q5 and Q6 are connected to the collector of transistor Q8. The collectors of transistors Q5 and Q9 are coupled to a positive voltage source +V through resistor R7 and the collectors of transistors Q6 and Q10 are coupled to +V through resistor R8. The collector of transistor Q7 is directly connected to voltage source +V. The write enable signal WA/WAB is applied across the bases of transistors Q7 and Q9 and also across the bases of transistors Q8 and Q10. Data bus DA/DAB is connected to the bases of transistors Q6 and Q5 and the data input signal A/AB supplied to the memory units is developed across the collectors of Q5 and Q6.

When the WA/WAB write control signal is not asserted, the bases of transistors Q9 and Q10 are driven high and the bases of transistor Q7 and Q8 are driven low so that transistor Q9 and transistor Q10 turn on and transistors Q7 and Q8 turn off. Equal amounts of the current supplied by current source I5 pass through transistors Q9 and Q10 and between resistors R7 and R8 so that the potential across resistor R7 is equal to the potential across resistor R8. Thus the potentials of the collectors of transistors Q5 and Q6 are equal and the data signal A/AB is driven to its third state, 0 voltage. When the WA/WAB write control signal is asserted, transistors Q7 and Q8 turn on and transistors Q9 and Q10 turn off. Current from current source I5 passes through transistor Q8 and through either transistor Q5 or transistor Q6 depending on which transistor Q5 or Q6 is on. If the signal on data bus DA/DAB is positive, the current passes through transistor Q6 and resistor R8 pulling the potential of the collector of transistor Q6 down, thereby driving the data signal A/AB positive. If the signal on data bus DA/DAB is negative, the current passes through transistor Q5 pulling down the potential of its collector and driving the data signal A/AB negative.

A preferred embodiment of the invention has been shown and described as a dual port memory, but alternative embodiments of the invention may have three or more ports. For example, with reference to FIG. 2, an additional memory cell C (not shown) and buffer similar to cells A and B and buffers 26 and 28 could be added to each memory unit 12 and the cross-coupling Y/YB signal supplied also to cell C, thereby to form a three-port memory unit. With reference to FIG. 1, an additional port C write control circuit and address decoder would be provided and interconnected to each memory unit to control read/write operations for the additional cells. Additional ports could be added in a similar manner by adding an additional cell to each memory unit and by adding an additional write control circuit and address decoder for each port.

The dual port memory of FIG. 1 stores one bit at each of n addresses. A memory storing more than one bit at each address may be provided simply by replicating the single bit memory of FIG. 1 to form multiple memory planes. However, the port A and B address decoders need not be replicated inasmuch as the SA* and SB* enabling signals may be transmitted in parallel to corresponding memory units of the multiple memory planes.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A dual port memory unit comprising:
   two ports, each comprising busses for conveying control and data signals;
   a pair of memory cells, one memory cell of the memory unit corresponding to each port, each memory cell comprising means for storing a single data bit of one of first and second states, each memory cell being independently read and write accessed through the corresponding port; and
   means cross-coupling the memory cells so that when the state of a bit stored by one of the cells of the memory unit is changed when write accessed, the other cell of the memory unit changes the state of its stored bit following the write access of said one cell.

2. The dual port memory unit in accordance with claim 1 wherein said cross-coupling means comprises means for providing a cross-coupling signal of one of first and second states applied to each cell of said memory unit and for setting the state of said cross-coupling signal in accordance with the state of the memory cell being write accessed.

3. The dual port memory unit in accordance with claim 2 wherein each memory cell further comprises means for setting the state of its stored bit in accordance with the state of said cross-coupling signal when neither memory cell is being accessed.

4. The multiple port memory unit in accordance with claim 2 wherein said cross-coupling means includes current source means for providing a current to each of said cells, wherein said cross-coupling signal is set by diversion of said current by the cell being write accessed from the remaining cell.

5. A data storage unit for a multiple port memory, the data storage unit comprising a plurality of memory cells, each of said memory cells storing a separate data bit and being responsive to a corresponding one of a plurality of data signals, a corresponding one of a plurality of enable signals, and a common cross-coupling signal, each memory cell setting its stored data bit and said cross-coupling signal to states in accordance with a state of its corresponding data signal when its corresponding enable signal is asserted, each memory cell setting the state of its stored data bit in accordance with the state of said cross-coupling signal when the enable signal to each of said memory cells is deasserted.

6. A data storage unit for a multiple port memory comprising a plurality of memory cells, each memory cell responsive to a separate read/write enable signal, a separate corresponding data signal, and a common cross-coupling signal, each memory cell storing a data bit of state set in accordance with a state of its corresponding data signal while said read/write enable signal is asserted when said data signal is of one of first and second states, and set in accordance with a state of said cross-coupling signal when the separate read/write enable signals are deasserted and said cross-coupling signal is of one of said first and second states, each memory cell setting its corresponding data signal to one of said first and second states in accordance with the state of its stored data bit when said read/write enable signal is asserted while said data signal is of a third state, each memory cell driving said cross-coupling signal to one of said first and second states in accordance with the state of its stored data bit while said read/write enable signal is asserted.

7. The data storage unit in accordance with claim 6 wherein each of said memory cells comprises:
first transistor means having a base, a collector, a first emitter and a second emitter;
second transistor means having a base, a collector, a first emitter and a second emitter;
first and second voltage clamps; and
a circuit node, said separate read/write enable signal being applied to said circuit node, the collector of said first transistor means being coupled to the base of said second transistor means and coupled to said circuit node by said first voltage clamp, the collector of said second transistor means being coupled to the base of said first transistor means and coupled to said circuit node by said second voltage clamp, said separate data signal being applied across the first emitters of said first and second transistor means, and said cross-coupling signal being applied across the second emitters of said first and second transistor means.

8. A multiple port memory comprising:
a plurality of ports, each comprising busses for conveying control and data signals;
a plurality of memory units, each memory unit comprising a pair of memory cells, one memory cell of each memory unit corresponding to each port, each memory cell comprising means for storing a single data bit of one of first and second states, each memory cell being independently read and write accessed through the corresponding port; and
means cross-coupling the memory cells of said each memory unit so that when the state of a bit stored by one of the cells of the memory unit is changed when write accessed, the other cell of the memory unit changes the state of its stored bit following the write access of said one cell.

9. The multiple port memory in accordance with claim 8 wherein said cross-coupling means provides a cross-coupling signal of one of first and second states applied to each cell of a memory unit and sets the state of said cross-coupling signal in accordance with the state of the memory cell being write accessed.

10. The multiple port memory in accordance with claim 9 wherein each memory cell of a memory unit further comprises means for setting the state of its stored bit in accordance with the state of said cross-coupling signal when no memory cell of a memory unit is being accessed.

11. The multiple port memory in accordance with claim 9 wherein said cross-coupling means includes current source means for providing a current to each of said cells, wherein said cross-coupling signal is set by diversion of said current by the cell being write accessed from the remaining cell.

12. A multiple port memory comprising:
a plurality of data busses, one corresponding to each of a plurality of ports, each conveying a data bit;
a plurality of address busses, one corresponding to each port, each conveying an address;
a plurality of control lines, one corresponding to each port, each conveying a separate write control signal;
a plurality of decoders, one corresponding to each port, each generating one of a separate set of output read/write enable signals in accordance with an address signal conveyed on a separate one of said address busses;
a plurality of write control circuits, one corresponding to each port, each setting a state of a separate one of a plurality of data signals in accordance with a state of a data bit conveyed on a separate one of said data busses when a write control signal conveyed on a separate one of said write control lines is of a first state, and setting the state of said data bit on said separate one of said data busses in accordance with the state of said data signal when said write control signal is of a second state;
a current source; and
a plurality of memory units, each memory unit comprising a plurality of memory cells, one corresponding to each of said ports, each memory cell of a memory unit responsive to a separate one of said read/write enable signals, and a separate one of said data signals, first transistor means having a base, a collector, a first emitter and a second emitter, second transistor means having a base, a collector, a first emitter and a second emitter, first and second resistors, first and second diodes, and a circuit node, said read/write enable signal being applied to said circuit node, the collector of said first transistor means being coupled to the base of said second transistor and being coupled to said circuit node by said first resistor and by said first diode, the collector of said second transistor means being coupled to the base of said first transistor means and being coupled to said circuit node by said second resistor and by said second diode, the data signal being applied across the first emitters of said first and second transistor means, a third resistor coupling said current source to a second emitter of one of said first and second transistor means of each of said memory cells, and a fourth resistor coupling said current source to a second emitter of another of said first and second transistors of each of said memory cells.

* * * * *